(12) United States Patent
Nakamura et al.

(10) Patent No.: US 7,363,014 B2
(45) Date of Patent: Apr. 22, 2008

(54) TRANSMITTING APPARATUS AND RADIO COMMUNICATION APPARATUS

(75) Inventors: Maki Nakamura, Yokosuka (JP); Mamoru Arayashiki, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 470 days.

(21) Appl. No.: 11/074,008

(22) Filed: Mar. 8, 2005

(65) Prior Publication Data
US 2005/0245214 A1 Nov. 3, 2005

(30) Foreign Application Priority Data
Mar. 9, 2004 (JP) .............................. 2004-065641

(51) Int. Cl.
*H04B 1/04* (2006.01)
*H01Q 11/12* (2006.01)

(52) U.S. Cl. .................. 455/127.3; 455/126; 455/108; 455/115.1

(58) Field of Classification Search ................ 455/108, 455/127.3, 127.1, 115.1, 126, 116, 67.1, 67.3, 455/127.4, 127.2, 91, 115.2, 115.4, 67.11, 455/67.13, 69, 114.3, 114.2; 375/146, 297, 375/296
See application file for complete search history.

(56) References Cited

U.S. PATENT DOCUMENTS 6,813,319 B1    11/2004  Nagle et al.
7,103,029 B1 *  9/2006   Minowa ...................... 455/126
2002/0064236 A1 * 5/2002  Matsuoka et al. .......... 375/296
2002/0159504 A1 * 10/2002 Chinda et al. .............. 375/146
2003/0067995 A1 * 4/2003  Matsuoka et al. .......... 375/296
2003/0099432 A1 * 5/2003  Furuki et al. ................. 385/24

FOREIGN PATENT DOCUMENTS

| JP | 3207153     | 9/1998 |
| JP | 2001 156554 | 6/2001 |
| JP | 2002 530917 | 9/2002 |
| JP | 2004 501527 | 1/2004 |
| WO | 0030250     | 5/2000 |
| WO | 0158012     | 8/2001 |

* cited by examiner

*Primary Examiner*—Nay Maung
*Assistant Examiner*—John J. Lee
(74) *Attorney, Agent, or Firm*—Dickinson Wright, PLLC

(57) ABSTRACT

A transmitting apparatus 100 operates a high-frequency power amplifier 105 as a nonlinear amplifier in a first mode, and operates high-frequency power amplifier 105 as a linear amplifier in a second mode. When high-frequency power amplifier 105 is operated as a nonlinear amplifier, the input level of high-frequency power amplifier 105 is varied by a variable gain amplifier 107 in accordance with the average output power of a transmit signal. Transmitting apparatus 100 is also provided with a compensation table 121 for reducing error in high-frequency power amplifier 105 mode switching operations.

8 Claims, 12 Drawing Sheets

121: COMPENSATION TABLE

| REQUIRED POWER VALUE (125) | MODE NUMBER (126) | AREA NUMBER (127) | FIRST COMPENSATION DATA (128) | SECOND COMPENSATION DATA (129) |
|---|---|---|---|---|
| 0 dBm | 1 | 1 | 1.00 V | 3 V |
| 1 dBm | 1 | 1 | 1.05 V | 3 V |
| 2 dBm | 1 | 1 | 1.10 V | 3 V |
| . . . | . . . | . . . | . . . | . . . |
| 100 dBm | 1 | 5 | 5 V | 0.2 V |
| 0 dBm | 2 | 1 | 0 V | 0.3 V |
| 1 dBm | 2 | 1 | 0.05 V | 0.4 V |
| 2 dBm | 2 | 1 | 0.1 V | 0.5 V |
| . . . | . . . | . . . | . . . | . . . |
| 100 dBm | 2 | 5 | 3 V | 3 V |

TRANSMITTING APPARATUS AND RADIO COMMUNICATION APPARATUS

BACKGROUND OF THE INVENTION

1. Field of the Invention

The present invention relates to a transmitting apparatus and radio communication apparatus, and more particularly to a transmitting apparatus and radio communication apparatus that perform power amplification of a transmit signal to output that signal.

2. Description of the Related Art

Heretofore, a class A or class AB linear amplifier has been used to linearly amplify an envelope fluctuation component in a high-frequency power amplifier that amplifies a modulation signal containing an envelope fluctuation component. This kind of linear amplifier has excellent linearity, but because it constantly consumes power associated with a DC bias component, so this kind of the linear amplifier has lower power efficiency than a class C, class D, class E or similar nonlinear amplifier. Consequently, when this kind of high-frequency power amplifier is applied to a portable radio device that uses a battery as its power source, usage time has been shortened due to the large power consumption of the high-frequency power amplifier. Also, when this kind of high-frequency power amplifier is applied to a base station apparatus of a radio system in which a plurality of high-power transmitting apparatuses are installed, this has resulted in a large apparatus size and increased heat generation.

Thus, the transmitting apparatus 1 employing a polar modulation method shown in FIG. 1 has been proposed as a high-efficiency transmitting apparatus. This transmitting apparatus 1 is equipped with an amplitude phase conversion section 2, an amplitude modulation signal amplifier 3, a frequency synthesizer 4, and a high-frequency power amplifier 5, which is a nonlinear amplifier.

A baseband modulation signal 20 is input to amplitude phase conversion section 2. A baseband amplification modulation signal 21 output from amplitude phase conversion section 2 is input to amplitude modulation signal amplifier 3. A baseband phase modulation signal 23 output from amplitude phase conversion section 2 is input to frequency synthesizer 4. A high-frequency phase modulation signal 24 output from frequency synthesizer 4 is input to high-frequency power amplifier 5. A transmit output signal 25 is output by high-frequency power amplifier 5.

Next, the operation of transmitting apparatus 1 will be described. First, if baseband modulation signal 20 is designated Si(t), this baseband modulation signal Si(t) can be expressed by Equation 1 below.

$$Si(t)=a(t)\exp[j\phi(t)] \qquad (1)$$

Here, a(t) is amplitude data and $\exp[j\phi(t)]$ is phase data. Amplitude data a(t) and phase data $\exp[j\phi(t)]$ are extracted from baseband modulation signal Si(t) by amplitude phase conversion section 2. Amplitude data a(t) corresponds to baseband amplification modulation signal 21, and phase data $\exp[j\phi(t)]$ corresponds to baseband phase modulation signal 23. Amplitude data a(t) is amplified by amplitude modulation signal amplifier 3 and provided to high-frequency power amplifier 5. By this means, the power supply voltage of high-frequency power amplifier 5 is set based on amplitude data a(t).

Frequency synthesizer 4 modulates carrier angular frequency $\omega c$ with phase data $\exp[j\phi(t)]$ and generates high-frequency phase modulation signal 24, which is input to high-frequency power amplifier 5. Here, if high-frequency phase modulation signal 24 is designated Sc, high-frequency phase modulation signal Sc can be expressed by Equation 2 below.

$$Sc=\exp[\omega ct+\phi(t)] \qquad (2)$$

By using a nonlinear amplifier for high-frequency power amplifier 5 in this way, a signal in which a power supply voltage value based on amplitude data a(t) of high-frequency power amplifier 5 and the output signal of frequency synthesizer 4 are multiplied together is generated amplified by gain G of high-frequency power amplifier 5. High-frequency power amplifier 5 outputs this amplified generated signal as transmit output signal 25. Here, if transmit output signal 25 is designed RF signal Srf, this RF signal Srf can be expressed by Equation 3 below.

$$Srf=Ga(t)Sc=Ga(t)\exp[\omega ct+\phi(t)] \qquad (3)$$

The signal input to high-frequency power amplifier 5 is a phase modulation signal that does not have an amplitude direction fluctuation component, and is thus a fixed envelope signal. Therefore, an efficient nonlinear amplifier can be used as high-frequency power amplifier 5, enabling a highly efficient transmitting apparatus 1 to be implemented. A transmitting apparatus employing a polar modulation transmitting method of this kind is described, for example, in Japanese Patent Publication No. 2002-530917 and Japanese Patent Publication No. 2004-501527.

However, with above-described transmitting apparatus 1, since high-frequency power amplifier 5 is a nonlinear amplifier, when the output power of high-frequency power amplifier 5 is controlled the output signal does not vary linearly with respect to the input signal. Therefore, the power supply voltage has to be varied in output signal control in the same way as in amplitude modulation. In this case, the output power control range has been limited by leakage power, transistor operating limits with respect to the power supply voltage, and so forth. There has also been a problem of error with respect to the required transmission power due to characteristic changes resulting from variations in electronic components of the transmitting apparatus, temperature fluctuations, and so forth.

SUMMARY OF THE INVENTION

It is an object of the present invention to provide a transmitting apparatus and radio communication apparatus that offer good power efficiency and a wide transmission output power control range, and enable stable power to be output.

The present invention employs a configuration comprising a transmission power amplification section that has a high-frequency power amplifier that outputs a transmit signal after performing power amplification of that signal, and a compensation section that performs compensation of the average output power of the high-frequency power amplification section; wherein the transmission power amplification section has a first mode in which the high-frequency power amplifier is operated as a nonlinear amplifier and amplitude modulation and average output level control of the transmit signal are performed based on the power supply voltage of the high-frequency power amplifier, and a second mode in which the high-frequency power amplifier is operated as a linear amplifier and amplitude modulation and average output level control of the transmit signal are performed in a stage prior to the high-frequency power amplifier; and the compensation section has a compensation table that stores compensation value information for compensating the average output level, and compensates the average output level based on the compensation value information stored in that compensation table.

BRIEF DESCRIPTION OF THE DRAWINGS

The above and other objects and features of the invention will appear more fully hereinafter from a consideration of the following description taken in conjunction with the accompanying drawing wherein one example is illustrated by way of example, in which.

DETAILED DESCRIPTION OF THE PREFERRED EMBODIMENTS

With reference now to the accompanying drawings, embodiments of the present invention will be explained in detail below. In the following embodiments, configuration elements that have the same functions are assigned the same codes and descriptions of duplicate parts are omitted.

Embodiment 1

[Configuration of Transmitting Apparatus]

Figure 1:
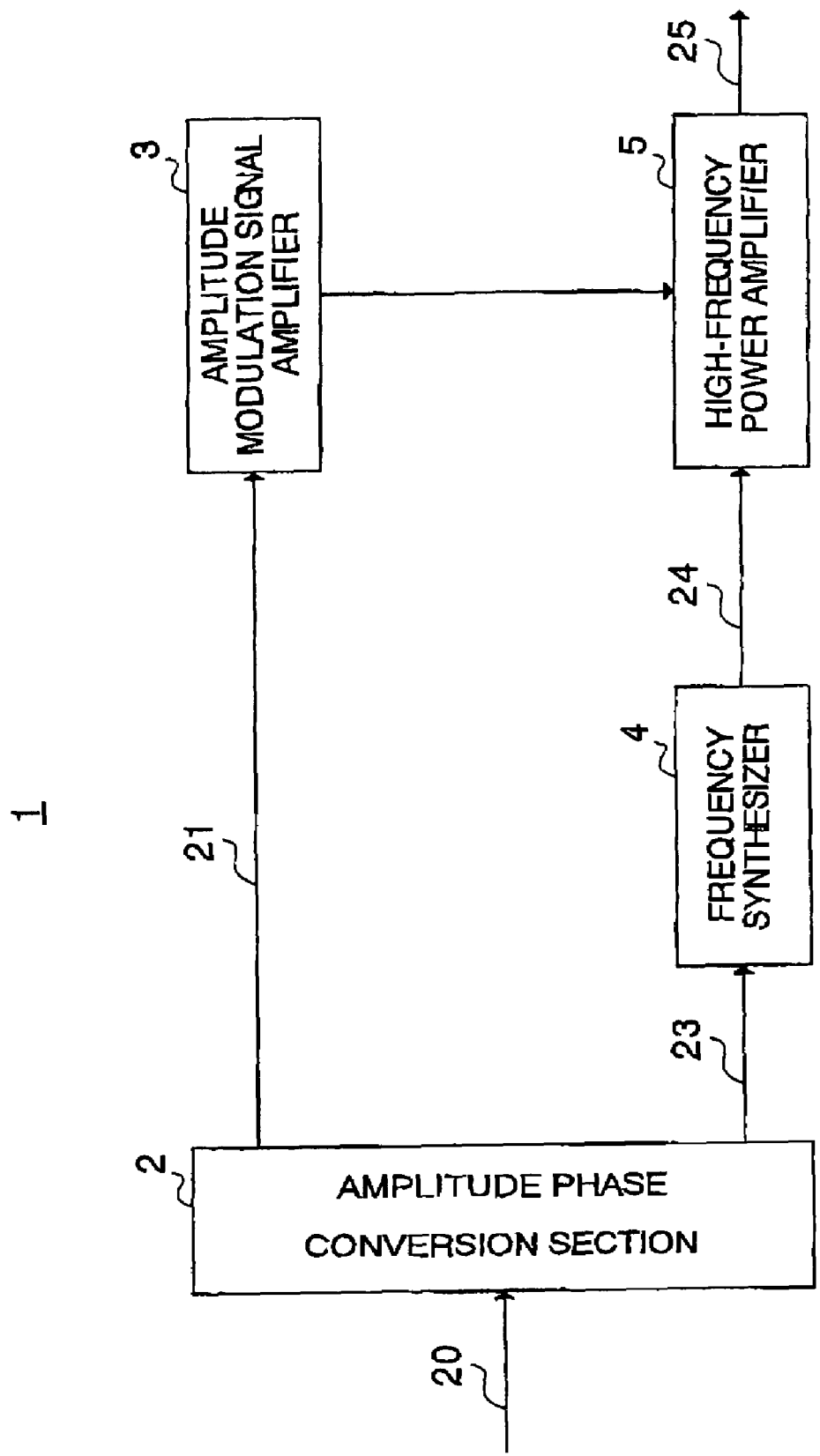
FIG. 1 is a block diagram of a transmitting apparatus according to the prior art.
Figure 2:
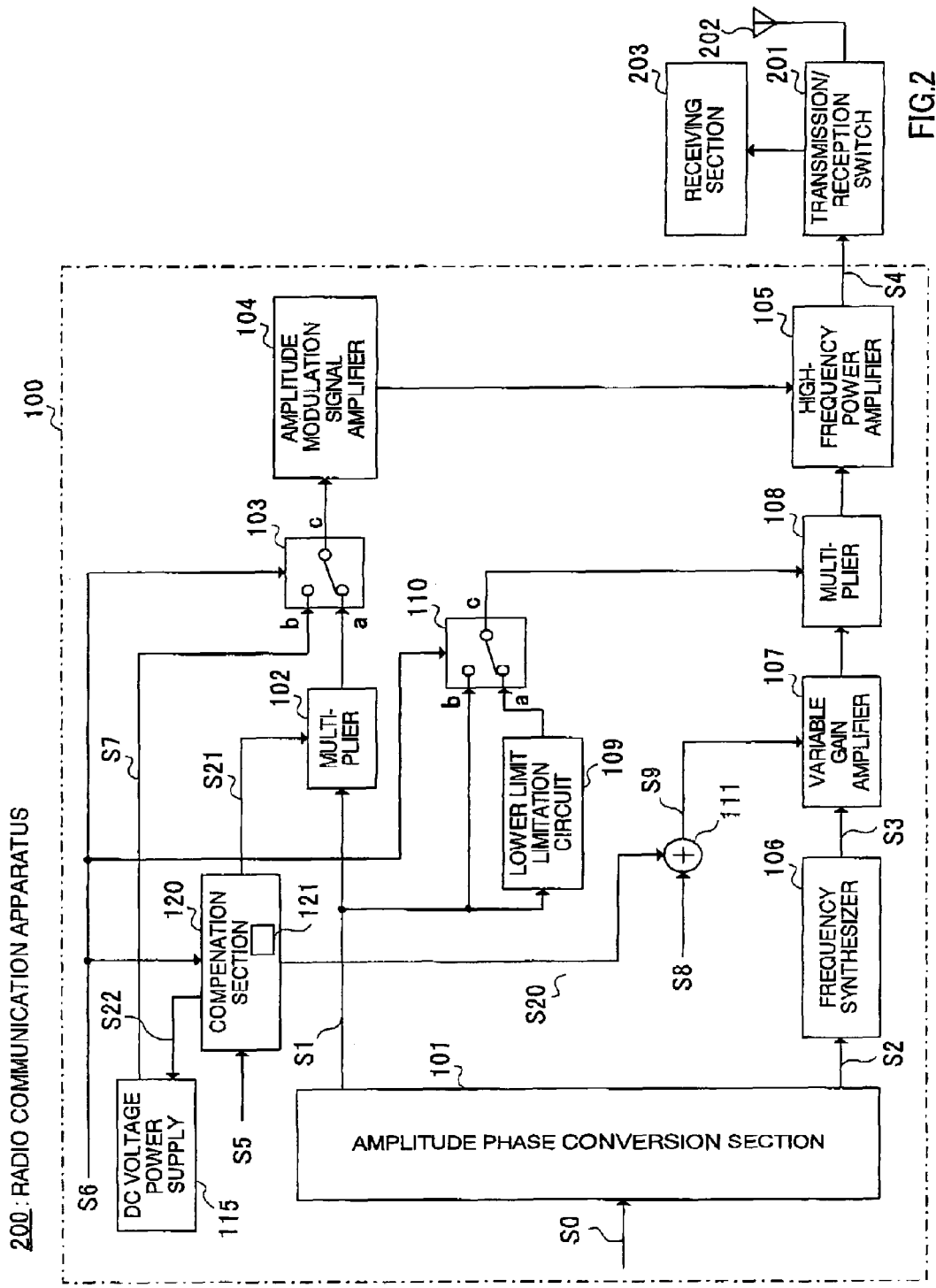
FIG. 2 is a block diagram showing the general configuration of a radio communication apparatus according to Embodiment 1 of the present invention.

FIG. 2 is a block diagram showing the general configuration of a radio communication apparatus according to Embodiment 1 of the present invention.

As shown in FIG. 2, a radio communication apparatus 200 according to Embodiment 1 of the present invention is equipped with a transmitting apparatus 100, a transmission/reception switch 201, an antenna 202, and a receiving section 203.

Transmitting apparatus 100 is equipped with an amplitude phase conversion section 101, a compensation section 120, a multiplier 102, a switch 103, an amplitude modulation signal amplifier 104, a high-frequency power amplifier 105, a frequency synthesizer 106, a variable gain amplifier 107, a multiplier 108, a lower limit limitation circuit 109, a switch 110, an adder 111, and a DC voltage power supply 115.

Amplitude phase conversion section 101 receives a baseband modulation signal S0 and separates this signal into a baseband amplification modulation signal S1 and baseband phase modulation signal S2. Multiplier 102 multiplies together the value (voltage value) of baseband amplification modulation signal S1 from amplitude phase conversion section 101 and the value (voltage value) of an amplitude modulation control signal S21 from compensation section 120. Switch 103 is subjected to switching control based on a mode switching signal S6. Hereinafter, a signal value is assumed to indicate a voltage value.

Amplitude modulation signal amplifier 104 supplies the power supply voltage to high-frequency power amplifier 105. High-frequency power amplifier 105 performs power amplification of the output signal from multiplier 108, and outputs a transmit output signal S4. Frequency synthesizer 106 performs phase modulation of the carrier signal with baseband phase modulation signal S2, and generates a high-frequency phase modulation signal S3. Variable gain amplifier 107 adjusts the signal level of high-frequency phase modulation signal S3.

Multiplier 108 multiplies together the value of the output signal from variable gain amplifier 107 and the value of baseband amplification modulation signal S. Lower limit limitation circuit 109 limits the lower limit value of amplitude fluctuation of baseband amplification modulation signal S1. Switch 110 is subjected to switching control by mode switching signal S6. Adder 111 adds together the value of a variable gain control signal S20 and the value of a gain offset signal S8.

Compensation section 120 receives a gain control signal S5 and mode switching signal S6. Compensation section 120 references a compensation table (assigned code 121, illustrated in FIG. 3) based on gain control signal S5 and mode switching signal S6, and has a first mode in which and variable gain control signal S20 and amplitude modulation control signal S21 are output, and a second mode in which baseband modulation signal 20 and a DC voltage source control signal S22 are output. DC voltage source control signal S22 is input to DC voltage power supply 115.

Figures 3, 4:
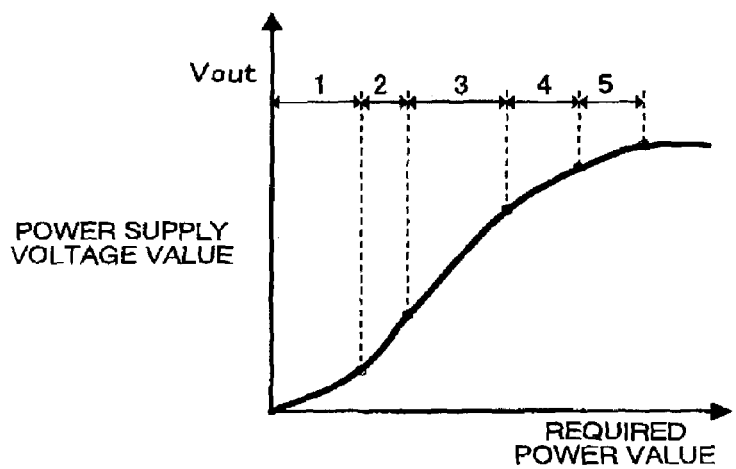
FIG. 3 is a drawing for explaining the information contents stored in the compensation table of the transmitting apparatus of a radio communication apparatus according to Embodiment 1 of the present invention.
FIG. 4 is a drawing showing the relationship between the required power value and output voltage value according to Embodiment 1 of the present invention.

Compensation section 120 is equipped with a compensation table 121 as shown in FIG. 3. Compensation table 121 stores information comprising a required power value 125, a mode number 126, an area number 127, first compensation data 128, and second compensation data 129. A value (dBm) corresponding to gain control signal S5 is stored as required power value 125. Information for differentiating between the first mode and second mode is stored as mode number 126.

As area number 127, area number information is stored when correction is performed with the transmitting apparatus 100 characteristic divided into a plurality of areas as shown in FIG. 4.

FIG. 4 shows a plot of required power values against output voltage values of high-frequency power amplifier 105 necessary to output the required power. In FIG. 4, the horizontal axis shows the required power value and the vertical axis shows the output voltage value. As shown in FIG. 4, the relationship between a required power value and the power supply voltage value of high-frequency power amplifier 105 is divided into linear areas, and predetermined compensation is performed for each of these area division ranges. By so doing, in contrast to the case where compensation is performed individually for each required power value, the number of compensation values for which updating is performed when compensation value updating is carried out depends on the number of area division ranges (a fixed compensation value for one area division range), and the time taken to perform compensation value updating is shortened.

As first compensation data 128, variable gain control signal S20 compensation value (voltage V) information is stored. As second compensation data 129, high-frequency phase modulation signal S3 compensation value (voltage V) information is stored in the first mode, and DC voltage source control signal S22 compensation value (voltage V) information is stored in the second mode.

Figure 5:
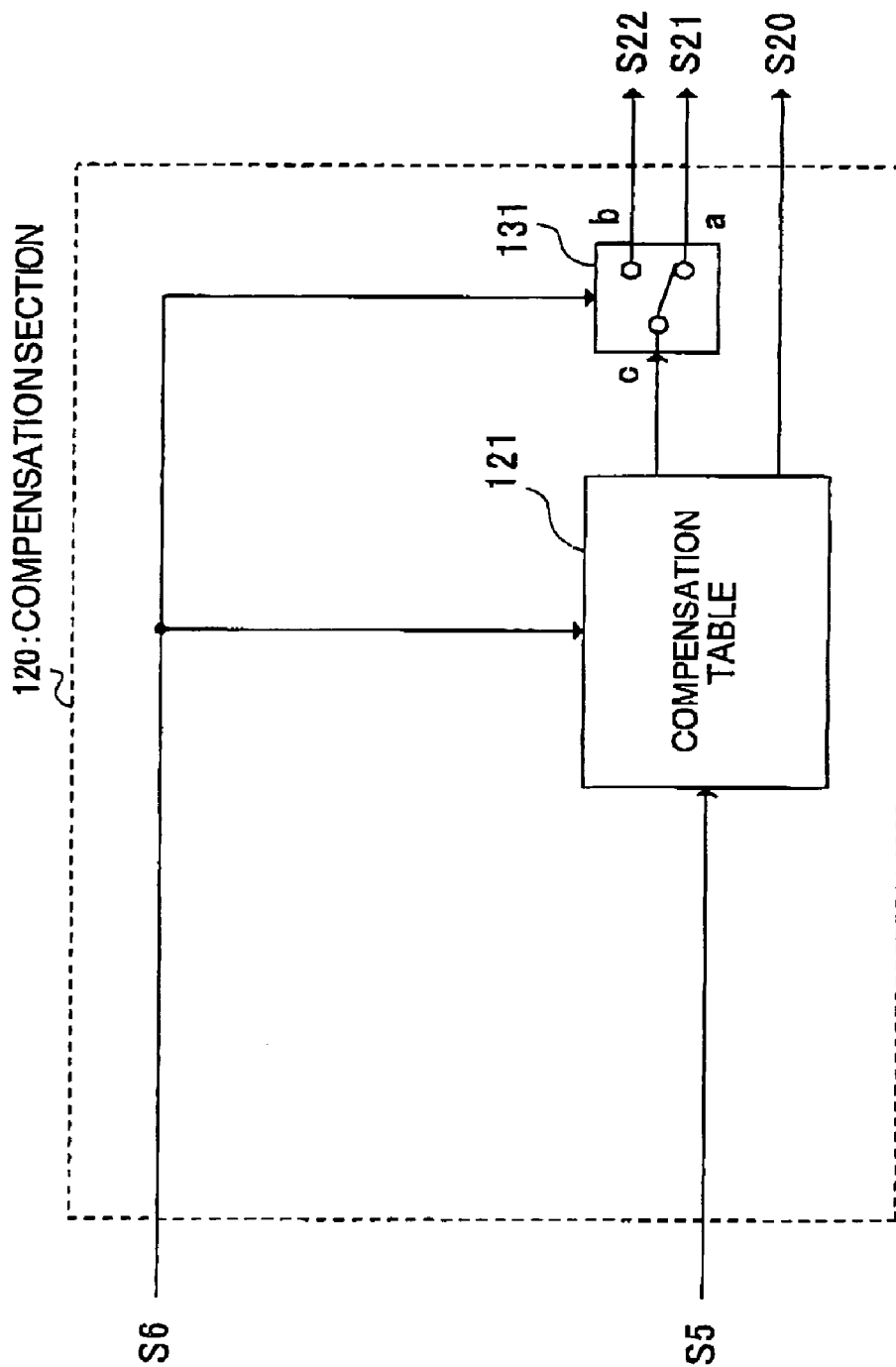
FIG. 5 is a block diagram showing the configuration of the compensation section of the transmitting apparatus of a radio communication apparatus according to Embodiment 1 of the present invention.

Compensation table 121 may also be configured so as not to include second compensation data 129. Also, in Embodiment 1 it has been assumed that the transmitting apparatus 100 characteristic is divided into a plurality of areas for compensation, as shown in FIG. 4, but compensation may also be performed for a single area rather than performing division-based compensation. In this case, the area number 127 information (item) is deleted from compensation table 121. By this means the amount of information in compensation table 121 can be reduced, enabling the memory capacity for constructing compensation table 121 to be decreased. Compensation section 120 is equipped with above-described compensation table 121 and a switch 131, as shown in FIG. 5.

[Operation of Transmitting Apparatus]

The operation of above-described transmitting apparatus 100 will now be explained. In transmitting apparatus 100 shown in FIG. 2, the operating mode of high-frequency power amplifier 105 is determined, for example, in accordance with a transmission power level specification from a base station apparatus to transmitting apparatus 100, or a transmission power level based on the state of a transmitting apparatus 100 received signal. When the level of transmit output signal S4 is high, it is desirable from a power efficiency standpoint to enter the operating mode in which high-frequency power amplifier 105 is a nonlinear amplifier (the first mode). On the other hand, when the level of transmit output signal S4 becomes low, and is outside the range in which it is possible for high-frequency power amplifier 105 to operate as a nonlinear amplifier, it is desirable to operate in the operating mode in which high-frequency power amplifier 105 is a linear amplifier (the second mode).

Compensation section 120 performs compensation of the average output power of high-frequency power amplifier 105. The operation of compensation section 120 will now be described in detail.

First, mode switching signal S6 and gain control signal S5 are input to compensation section 120. In compensation section 120, gain control signal S5 is compared with required power value 125 of compensation table 121, and mode switching signal S6 is compared with mode number 126 of compensation table 121. If the result of the comparison is that both match, first compensation data 128 and second compensation data 129 of the same row of compensation table 121 are output from compensation table 121.

First compensation data 128 is output as variable gain control signal S20. Also, in the first mode, terminal a and terminal c of switch 131 (see FIG. 5) are connected by means of mode switching signal S6, and second compensation data 129 is output as amplitude modulation control signal S21 via switch 131.

In the second mode, terminal b and terminal c of switch 131 are connected by means of mode switching signal S6, and second compensation data 129 is output as DC voltage source control signal S22 via switch 131.

Next, the compensation table 121 compensation value determination operation by compensation section 120 will be described. Storage (input) of information stored in compensation table 121 is performed from outside. Here, "outside" is used in the sense of equipment external to transmitting apparatus 100 or radio communication apparatus 200, for example, and more specifically, data writing equipment of a factory that manufactures transmitting apparatus 100 or radio communication apparatus 200. First, a reference value determined beforehand through experimentation or the like is prepared.

Updating of compensation table 121 compensation values is performed in accordance with average transmission power in different transmitting apparatuses 100 based on this reference value, and the updated compensation values are held as information stored in compensation table 121. By this means, compensation tables 121 suited to different characteristics can be provided in different transmitting apparatuses 100.

Mode switching signal S6 is set based on the desired transmission power level and the high-frequency power amplifier 105 characteristic. A DC voltage S7 is output from DC voltage power supply 115. Here, gain control signal S5, mode switching signal S6, and gain offset signal S8 input to transmitting apparatus 100 are set and supplied by a control section, for example (not shown). The control section is provided inside transmitting apparatus 100. Also, when transmitting apparatus 100 is incorporated in a radio communication apparatus, for example, the control section may be jointly used as the control section that controls the operation of the radio communication apparatus.

First, the first mode in which the level of high-frequency power amplifier 105 transmit output signal S4 is comparatively high will be described. At this time, high-frequency power amplifier 105 operates as a saturation operation or switching operation area nonlinear amplifier. Baseband modulation signal S0 is separated into baseband amplification modulation signal S1 and baseband phase modulation signal S2 by amplitude phase conversion section 101.

The value of baseband amplification modulation signal S1 is multiplied by the value of amplitude modulation control signal S21 by multiplier 102, and the multiplier 102 output signal is input to terminal a of switch 103. When amplitude modulation is performed by high-frequency power amplifier 105 (when the level of transmit output signal S4 is comparatively high), terminal a and terminal c of switch 103 are connected by means of mode switching signal S6. The value resulting from multiplication of the baseband amplification modulation signal S1 value and amplitude modulation control signal S21 value, output from terminal c of switch 103, is amplified by amplitude modulation signal amplifier 104, and this amplified signal is supplied to high-frequency power amplifier 105 as the high-frequency power amplifier 105 power supply voltage. Amplitude modulation is performed by high-frequency power amplifier 105.

Here, since amplitude modulation signal amplifier 104 can vary the power supply voltage highly efficiently in accordance with the level of baseband amplification modulation signal S1, use of a class D amplifier representing amplitude information in pulse width form is desirable.

Meanwhile, baseband phase modulation signal S2 is input to frequency synthesizer 106. Frequency synthesizer 106 generates and outputs high-frequency phase modulation signal S3 in which the carrier signal has been phase modulated with baseband phase modulation signal S2. This high-frequency phase modulation signal S3 is amplified (or attenuated) by variable gain amplifier 107 based on a gain control signal S9, and output to multiplier 108.

Here, gain control signal S9 input to variable gain amplifier 107 is obtained by adding together the value of gain control signal S5 and the value of gain offset signal S8 with adder 111. Gain offset signal S8 is set so that variable gain amplifier 107 adjusts to a signal level suitable for operating high-frequency power amplifier 105 as a saturation operation or switching operation area nonlinear amplifier.

When the level of transmit output signal S4 is comparatively high, terminal a and terminal c of switch 110 are connected by means of mode switching signal S6. Therefore, a signal that limits the lower limit value of amplitude fluctuation of baseband amplification modulation signal S1 is provided by lower limit limitation circuit 109 to multiplier 108 via this switch 110.

By this means, the signal resulting from multiplication by multiplier 108 of the variable gain amplifier 107 output signal value and the value of the signal limiting the lower limit value of baseband amplification modulation signal S1 amplitude fluctuation becomes a phase modulation signal. This phase modulation signal output from multiplier 108 is input to high-frequency power amplifier 105, the phase modulation signal value is multiplied by the amplitude modulation signal value and becomes transmit output signal S4, and is output from high-frequency power amplifier 105.

Figure 6:
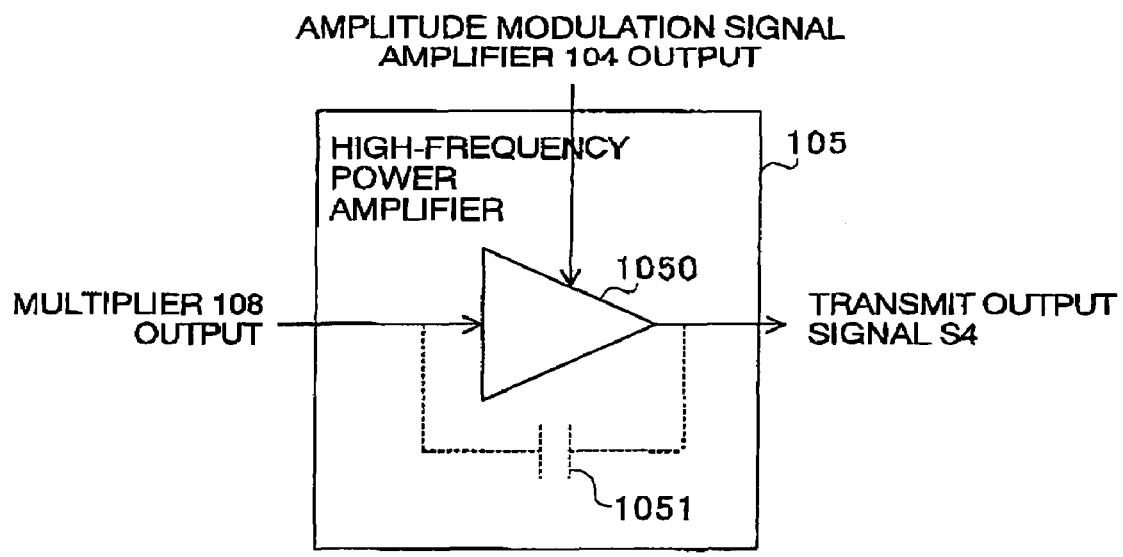
FIG. 6 is a block diagram showing the circuit configuration when the high-frequency power amplifier of the transmitting apparatus shown in FIG. 2 is operated as a nonlinear amplifier.
Figure 7:
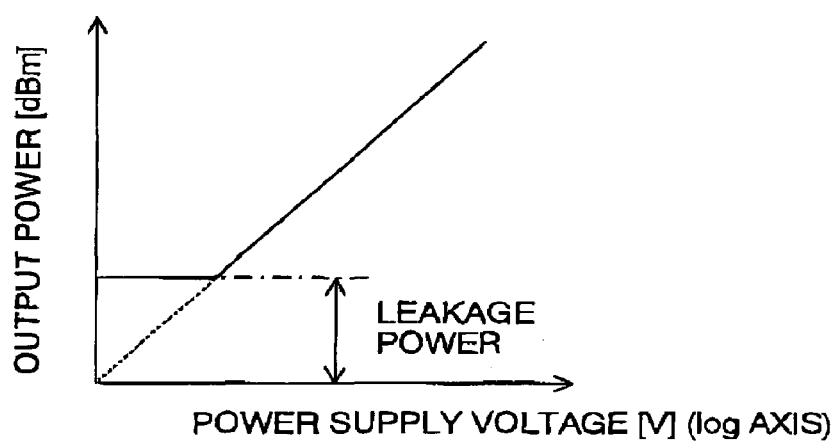
FIG. 7 is a characteristic curve of the high-frequency power amplifier shown in FIG. 3.

When operated as a nonlinear amplifier, high-frequency power amplifier 105 is equipped with a nonlinear amplifier 1050, and a parasitic capacitance 1051 is also provided between the input side and output side of nonlinear amplifier 1050, as shown in FIG. 6. In nonlinear amplifier 1050, the square of the power supply voltage and the output voltage are compared, as shown in FIG. 7. Here, the size of the leakage power is determined by parasitic capacitance 1051 and the nonlinear amplifier 1050 input signal level (multiplier 108 output signal level).

If variable gain amplifier 107 and multiplier 108 are not provided, the output level of frequency synthesizer 106 is virtually fixed, and therefore the leakage power is also fixed. In order to lower the level of transmit output signal S4, the high-frequency power amplifier 105 power supply voltage may be lowered, but this is limited by the leakage power, and the level cannot be lowered below a certain level.

On the other hand, in Embodiment 1, leakage power can be reduced by controlling the gain of variable gain amplifier 107 by means of gain control signal S9, and controlling the level of the phase modulation signal input to high-frequency power amplifier 105. Therefore, the range of output power control by the power supply voltage can be extended in high-frequency power amplifier 105. Amplifying baseband phase modulation signal S2 based on gain control signal S5 that sets the amplitude modulation signal average output in this way enables level control by variable gain amplifier 107 to track the average power of the amplitude modulation signal—that is, enables high-frequency power amplifier 105 input to be controlled in accordance with the average output power.

Moreover, multiplying the variable gain amplifier 107 output signal value by the baseband amplification modulation signal S1 value with multiplier 108 makes it possible for the high-frequency power amplifier 105 input level to track instantaneous level fluctuations of the amplitude modulation signal, and for leakage power to be reduced, enabling the reproducibility of instantaneous level fluctuations to be improved. That is to say, high-frequency power amplifier 105 input can be controlled in accordance with instantaneous output power.

If the high-frequency power amplifier 105 input level is lowered excessively, it will be outside the saturation operation or switching operation area range, and linearity with respect to power supply voltage variations will degrade. Therefore, lower limit limitation circuit 109 is provided to keep the high-frequency power amplifier 105 input level at or above a fixed value. As leakage power can be reduced by tracking amplitude fluctuations without applying amplitude modulation to transmit output signal S4 in multiplier 108, there is no problem from the characteristic standpoint if the low level side of instantaneous level fluctuations is limited.

Next, the second mode in which the level of transmit output signal S4 is comparatively low will be described. At this time, high-frequency power amplifier 105 operates as a linear amplifier with a linear input/output relationship. First, terminal b and terminal c of switch 103 are connected by means of mode switching signal S6. As a result, DC voltage value S7 is input from amplitude modulation signal amplifier 104 via switch 103, and amplitude modulation signal amplifier 104 supplies a constant power supply voltage to high-frequency power amplifier 105.

Meanwhile, baseband phase modulation signal S2 is input to frequency synthesizer 106, and frequency synthesizer 106 performs phase modulation of the carrier signal with baseband phase modulation signal S2 and outputs phase modulated high-frequency phase modulation signal S3 to variable gain amplifier 107. High-frequency phase modulation signal S3 is amplified (or attenuated) by variable gain amplifier 107 based on gain control signal S9, and the output of variable gain amplifier 107 is input to multiplier 108. In this case, gain offset signal S8 is set to 0. Therefore, gain control signal S5 (=gain control signal S9) is input to variable gain amplifier 107 via adder 111.

In this case, also, terminal b and terminal c of switch 110 are connected by means of mode switching signal S6. Therefore, baseband amplification modulation signal S1 is input to multiplier 108 via switch 110. Multiplier 108 multiplies together the value of high-frequency phase modulation signal S3 amplified by variable gain amplifier 107 and the value of baseband amplification modulation signal S1. High-frequency power amplifier 105 performs linear amplification of the output of multiplier 108, and outputs transmit output signal S4.

Therefore, amplifier 105 can be operated as a linear amplifier even when the level of transmit output signal S4 is low and there is a possibility of transmit output signal S4 falling outside the high-frequency power amplifier 105 saturation operation or switching operation area range—that is, when the linearity of output power with respect to power supply voltage variations degrades—enabling the linearity of an output signal with respect to an input signal to be maintained, and the output power control range to be extended.

Thus, according to Embodiment 1, in a first mode in which the level of transmit output signal S4 is comparatively high, high-frequency power amplifier 105 is operated as nonlinear amplifier 1050, and amplitude modulation and average output level control can be performed by means of the power supply voltage supplied to high-frequency power amplifier 105, and in a second mode in which the transmit output signal level is comparatively low, high-frequency power amplifier 105 is operated as a nonlinear amplifier, amplitude modulation can be performed by multiplier 108 located before high-frequency power amplifier 105 and average output level control can be performed by variable gain amplifier 107 located before multiplier 108, and the transmit output signal S4 level can be controlled over a wide range.

Also, according to Embodiment 1, when transmit output signal S4 level is high, high-frequency power amplifier 105 can be operated as a nonlinear amplifier, enabling power efficiency to be improved.

Moreover, according to Embodiment 1, when high-frequency power amplifier 105 is operated as a nonlinear amplifier, the level of high-frequency phase modulation signal S3 can be varied by controlling the gain of variable gain amplifier 107 by means of gain control signal S9, and the level of leakage power can be reduced, enabling the range of output power control by means of the power supply voltage to be extended.

Furthermore, according to Embodiment 1, by multiplying the high-frequency phase modulation signal S3 value by the baseband amplification modulation signal S1 value with multiplier 108, the high-frequency power amplifier 105 input level tracks instantaneous level fluctuations of baseband amplification modulation signal S1, and leakage power can also be reduced, enabling the reproducibility of instantaneous level fluctuations to be improved.

[Configuration of Radio Communication Apparatus]

As shown in FIG. 2, radio communication apparatus 200 according to Embodiment 1 of the present invention is equipped with above-described transmitting apparatus 100, transmission/reception switch 201 which is connected to the output side of high-frequency power amplifier 105 of transmitting apparatus 100 and to which transmit output signal S4 is input, and antenna 202 connected to transmission/reception switch 201.

Here, radio communication apparatus 200 includes at least, for example, a portable radio terminal apparatus such as a mobile phone or a portable information terminal that has a communication function, a radio communication apparatus installed in a radio base station, and so forth.

[Operation of Radio Communication Apparatus]

The operation of above-described radio communication apparatus 200 will now be explained. Here the operation of radio communication apparatus 200 as a portable radio terminal apparatus will be described.

When transmitting, radio communication apparatus 200 transmits transmit output signal S4 that has undergone power amplification by high-frequency power amplifier 105 from antenna 202 via transmission/reception switch 201.

When receiving, on the other hand, radio communication apparatus 200 inputs a received signal from antenna 202 to transmission/reception switch 201, and this transmission/reception switch 201 outputs the received signal to receiving section 203.

In Embodiment 1, it is assumed that updating of compensation table 121 of compensation section 120 is performed based on average transmission power, but a reference value may also be stored directly in compensation table 121 without performing this update processing. In this case, once a reference value has been decided, the same reference value can be used by different transmitting apparatuses 100, and therefore the processing for storing compensation value information in compensation table 121 from outside can be reduced.

Thus, according to Embodiment 1, compensation section 120 is provided in transmitting apparatus 100 or radio communication apparatus 200, and high-frequency power amplifier 105 average output power compensation is performed with compensation table 121 of this compensation section 120 switched on a mode-by-mode basis, enabling characteristic variations of individual transmitting apparatus 100 or radio communication apparatus 200 products to be reduced, and furthermore, errors when switching between the first mode and second mode can be reduced, enabling highly precise and stable frequency amplification to be implemented.

Also, according to Embodiment 1, compensation values corresponding to the first mode and second mode are stored in compensation table 121, making optimal mode switching possible.

Moreover, according to Embodiment 1, compensation values are stored in compensation table 121 for each mode, enabling a plurality of switching points to be established, thereby making possible mode switching at the optimal point; and also, a switching point from the first mode to the second mode and a switching point from the second mode to the first mode can be separated, making it possible to use only the minimum necessary mode switching for required power in the vicinity of a mode switching point.

Embodiment 2

Figure 8:
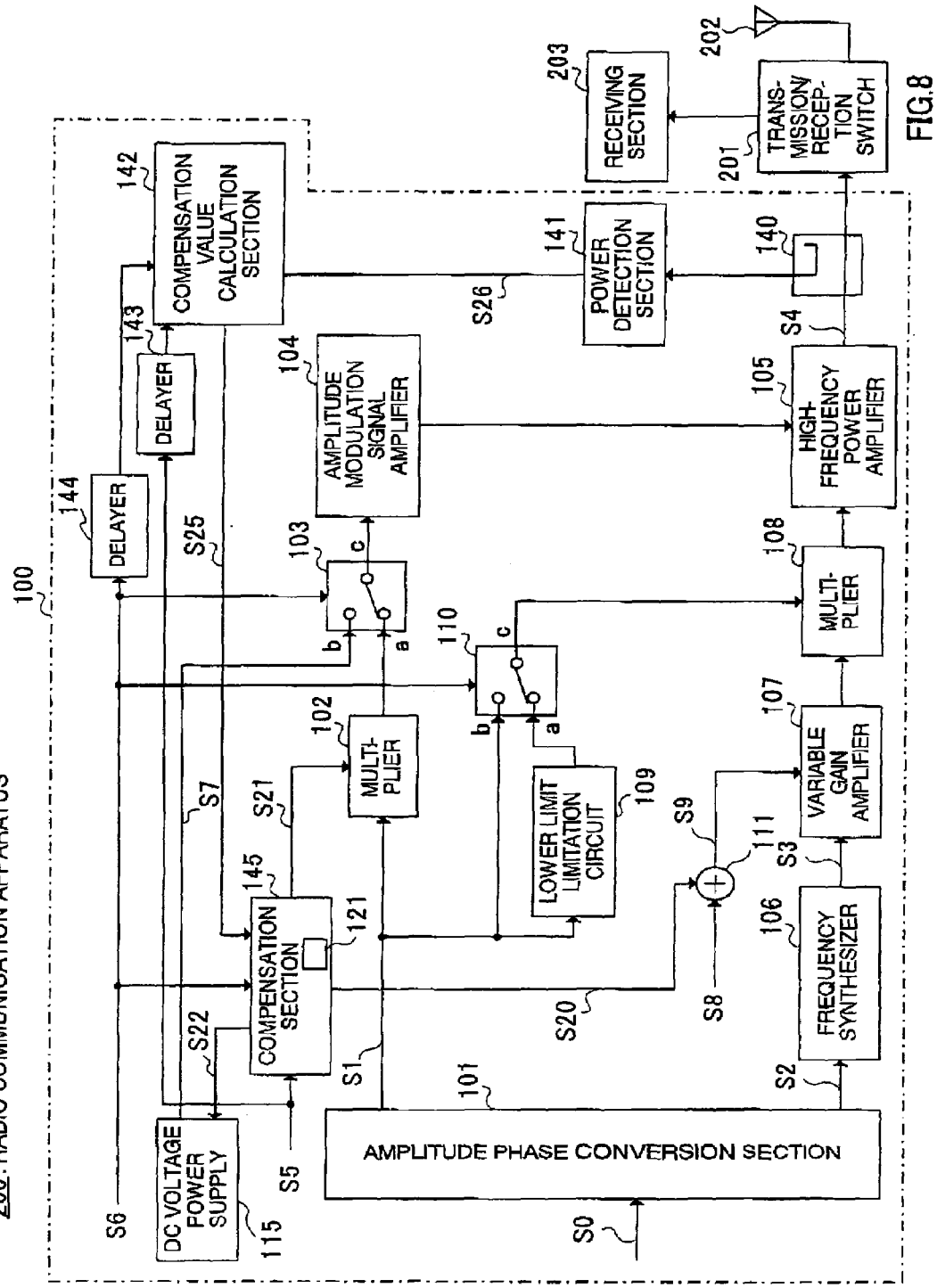
FIG. 8 is a block diagram showing the general configuration of a radio communication apparatus according to Embodiment 2 of the present invention.

Embodiment 2 of the present invention will now be described with reference to the accompanying drawings. FIG. 8 is a block diagram showing the configuration of a radio communication apparatus according to Embodiment 2 of the present invention. Configuration elements in Embodiment 2 of the present invention identical to those in Embodiment 1 of the present invention are assigned the same codes as in Embodiment 1, and descriptions thereof are omitted.

[Configuration of Transmitting Apparatus and Radio Communication Apparatus]

As shown in FIG. 8, a transmitting apparatus 100 according to Embodiment 2 of the present invention and a radio communication apparatus 200 in which this transmitting apparatus 100 is incorporated are equipped with a power detection section 141, a compensation value calculation section 142, and a compensation section 145, in addition to the configurations of transmitting apparatus 100 and radio communication apparatus 200 according to Embodiment 1. Power detection section 141 detects average output power output from high-frequency power amplifier 105. Compensation value calculation section 142 calculates a compensation value based on the average output power detected by power detection section 141. Compensation section 145 has a compensation table 121, and updates compensation values stored in this compensation table 121.

Transmitting apparatus 100 and radio communication apparatus 200 are also equipped with a coupler 140 and delayers 143 and 144. Coupler 140 extracts high-frequency power amplifier 105 output. Delayer 143 performs delay adjustment of gain control signal S5 and provides the delay-adjusted signal to compensation value calculation section 142. Delayer 144 performs delay adjustment of mode switching signal S6 and provides the delay-adjusted signal to compensation value calculation section 142. In transmitting apparatus 100 and radio communication apparatus 200, compensation values of compensation table 121 provided in compensation section 145 can be updated.

Figure 9:
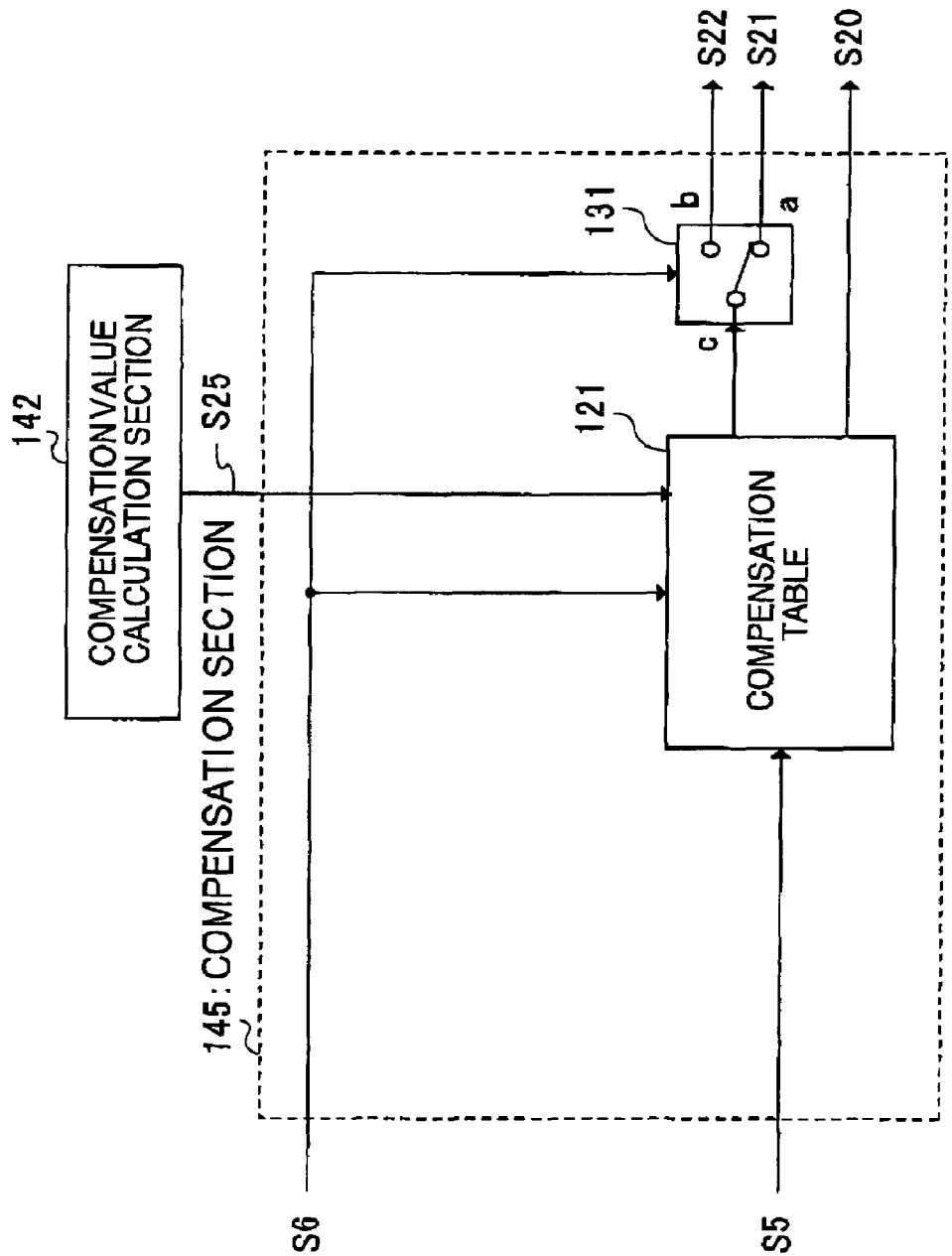
FIG. 9 is a block diagram showing the configuration of the compensation section of the transmitting apparatus of a radio communication apparatus according to Embodiment 2 of the present invention.

As shown in FIG. 9, compensation section 145 basically has the same structure as compensation section 120 of transmitting apparatus 100 and radio communication apparatus 200 according to Embodiment 1, but is newly equipped with compensation value calculation section 142, and therefore a compensation table update value S25 output from compensation value calculation section 142 is input to compensation table 121.

Figure 10:
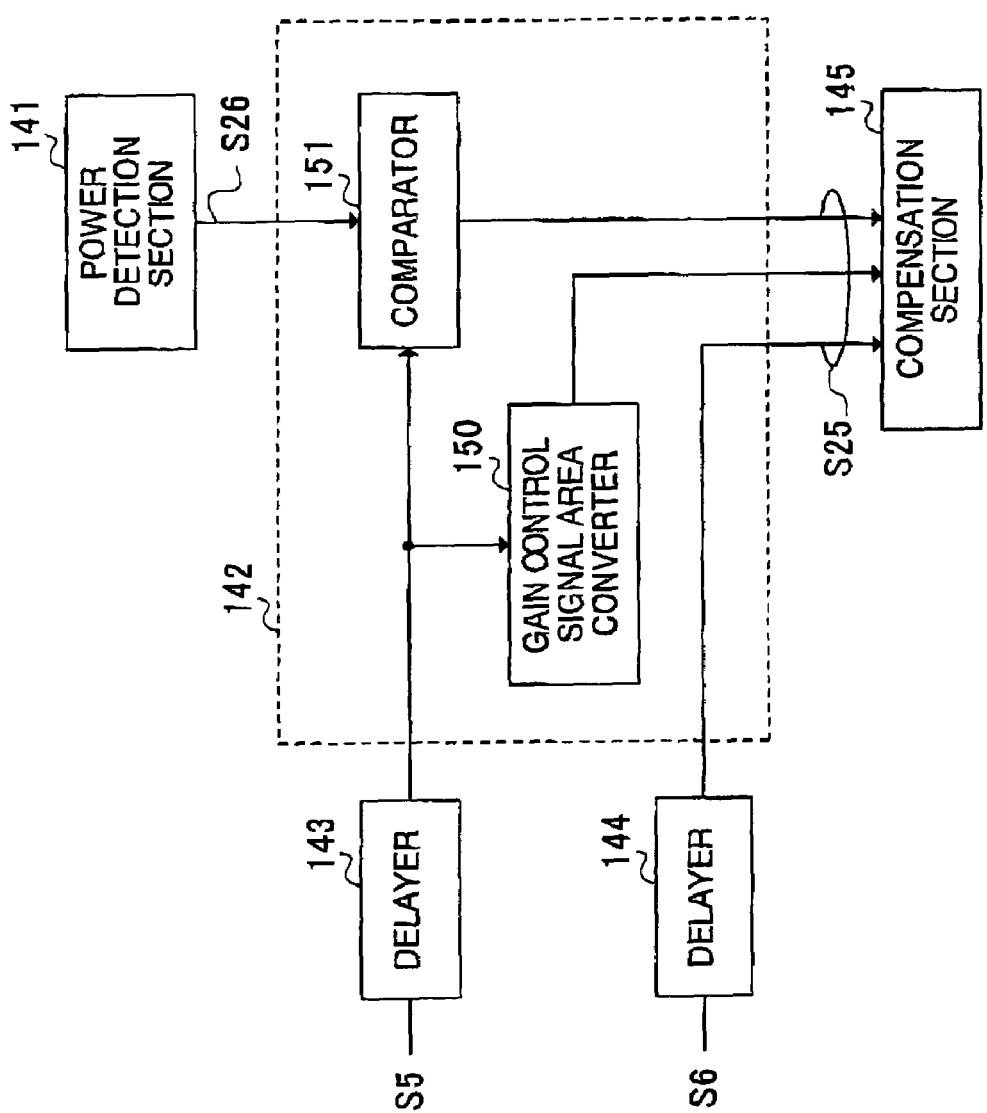
FIG. 10 is a block diagram showing the configuration of the compensation value calculation section of the transmitting apparatus of a radio communication apparatus according to Embodiment 2 of the present invention.

As shown in FIG. 10, compensation value calculation section 142 is equipped with a gain control signal area converter 150 and a comparator 151.

[Transmitting Apparatus and Radio Communication Apparatus Compensation Control Operation]

Figure 11:
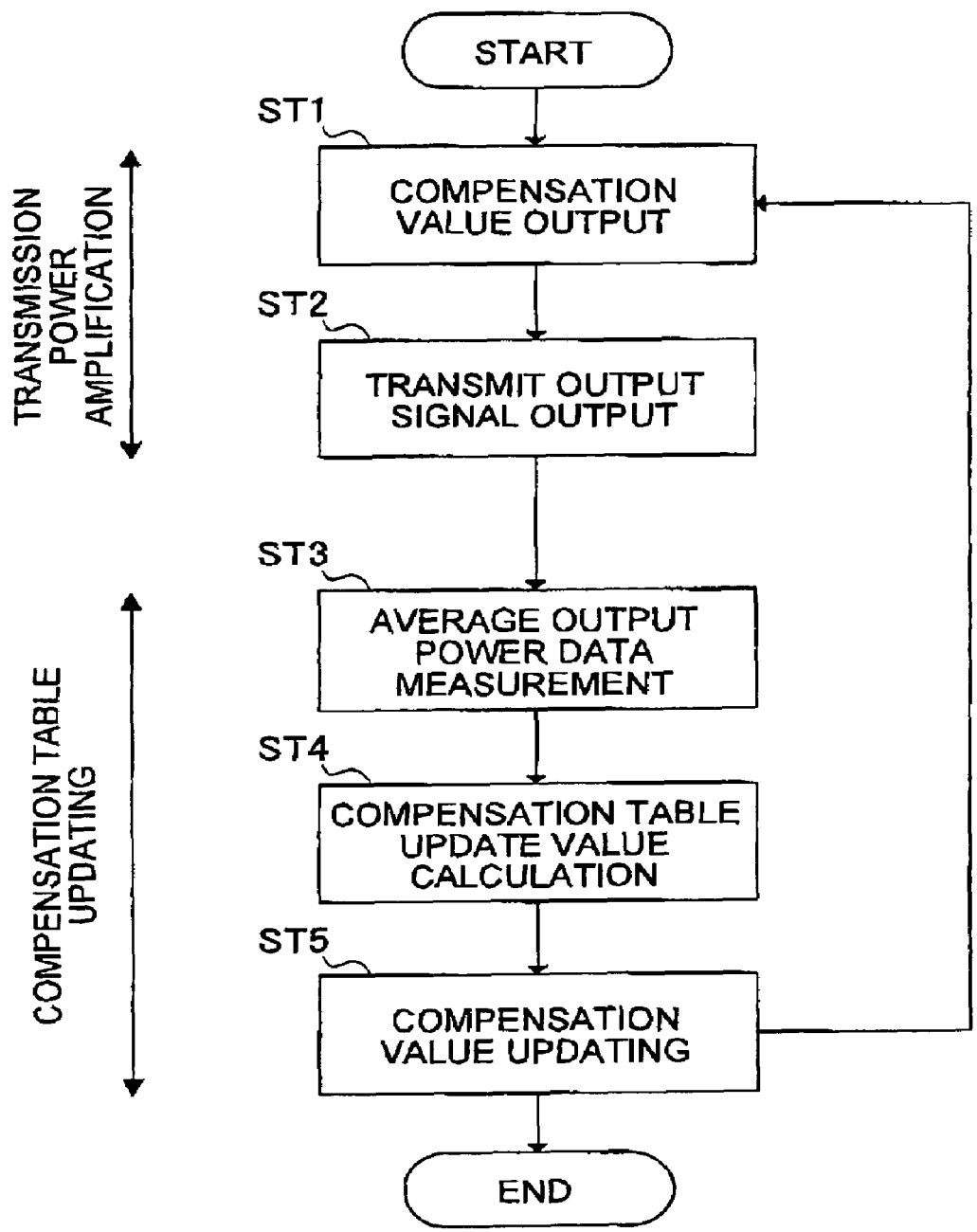
FIG. 11 is a flowchart explaining the compensation control operation of the transmitting apparatus and radio communication apparatus shown in FIG. 8.

A compensation control operation for the output power of transmit output signal S4 output from high-frequency power amplifier 105 in transmitting apparatus 100 and radio communication apparatus 200 according to Embodiment 2 of the present invention will now be described using FIG. 10 and FIG. 11.

First, using gain control signal S5 and mode switching signal S6, amplitude modulation control signal (compensation value) S21 is output from compensation section 145 as shown in step ST1. Here, the compensation value is an initial value that is provided from outside transmitting apparatus 100 and radio communication apparatus 200 when the product is shipped, for example. For initial value setting, an optimal reference value is first prepared beforehand through experimentation or the like as the initial value.

Based on this reference value, transmitting apparatus 100 and radio communication apparatus 200 individually perform updating of compensation table 121 of compensation section 145, and the data stored in this updated compensation table 121 is used as initial value data. The initial value is stored in a part of compensation table 121 or a storage apparatus such as nonvolatile memory provided separately, and is stored in compensation table 121 from the storage device when the transmitting apparatus 100 or radio communication apparatus 200 system is started up.

High-frequency power amplifier 105 outputs a compensated appropriate transmit output signal S4 based on the compensation value output from compensation section 145, as shown in step ST2.

Transmit output signal S4 output from high-frequency power amplifier 105 is input to transmission/reception switch 201 via coupler 140 shown in FIG. 8. Power detection section 141 measures average output power data S26 as digital data from transmit output signal S4 via coupler 140, as shown in step ST3. Measured average output power data S26 is output to compensation value calculation section 142.

In compensation value calculation section 142, as shown in step ST4, average output power data S26 and gain control signal S5 are compared, and compensation table update value S25 is calculated. In compensation value calculation section 142, the value of average output power data S26 output from power detection section 141 and the value of gain control signal S5 used for compensation section 120 referencing in average output power data S26 measurement are compared in size by comparator 151 shown in FIG. 10. Comparator 151 provides to compensation section 145, as compensation table update value S25, an "UP" command that raises the compensation value if the average output power data S26 value is smaller than the gain control signal S5 value, or a "Down" command that lowers the compensation value if the average output power data S26 value is larger than the gain control signal S5 value.

Gain control signal S5 is used in compensation table update value S25 calculation, and is input to compensation value calculation section 142 via delayer 143. Gain control signal S5 is input to gain control signal area converter 150, which converts the gain control signal S5 value to area number 127 information of compensation table 121 shown in FIG. 3, and provides this information to compensation section 145. Mode switching signal S6 is input to compensation value calculation section 142 via delayer 144, and is provided directly to compensation section 145 as compensation table update value S25.

If compensation section 145 receives an "UP" command as compensation table update value S25, updating is performed to increase the first compensation data 128 and second compensation data 129 compensation values by a fixed step, such as 1 dB, for example, as shown in step ST5. If compensation section 145 receives a "Down" command as compensation table update value S25, it performs updating to decrease the first compensation data 128 and second compensation data 129 compensation values by a fixed step. That is to say, compensation table 121 compensation values are updated.

The compensation control processing in step ST1 through step ST5 is repeated until there is no longer any difference when average output power data S26 and gain control signal S5 are compared. This compensation table 121 compensation value updating is performed continuously. This compensation table 121 compensation value updating need not necessarily be performed continuously, but may be performed periodically or when an update request is issued.

Here, an example has been described in which a compensation table 121 initial value is created by update processing based on a reference value, but it is possible to for a reference value itself to be used directly as a compensation table 121 initial value. In this case, once a reference value has been set, a common reference value can be used as a compensation table 121 initial value in a plurality of transmitting apparatuses 100 and radio communication apparatuses 200, enabling compensation control processing to be reduced.

[Sample Modification of Compensation Value Calculation Section]

Figure 12:
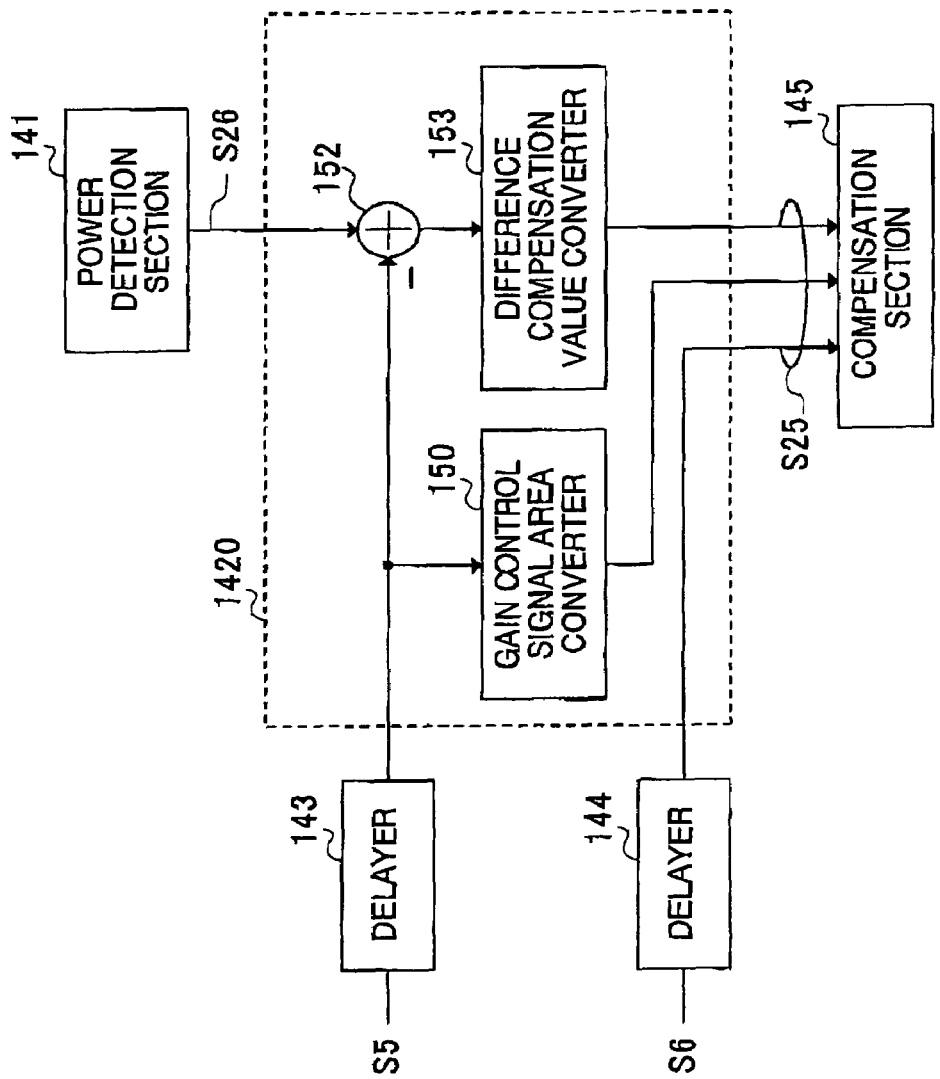
FIG. 12 is a block diagram showing the general configuration according to a sample variation of the compensation value calculation section of the transmitting apparatus and radio communication apparatus shown in FIG. 8.

Transmitting apparatus 100 and radio communication apparatus 200 according to Embodiment 2 of the present invention may be configured with the compensation value calculation section 1420 shown in FIG. 12 provided instead of compensation value calculation section 142 shown in FIG. 10. This compensation value calculation section 1420 is equipped with an adder 152, difference compensation value converter 153, and gain control signal area converter 150. Adder 152 adds together the value of average output power data S26 output from power detection section 141 and the value of gain control signal S5 input via delayer 143. Difference compensation value converter 153 receives the output signal output from adder 152.

A compensation control operation in a transmitting apparatus 100 and radio communication apparatus 200 equipped with this compensation value calculation section 1420 is carried out as described below.

Average output power data S26 output from power detection section 141 and gain control signal S5 used for compensation section 145 referencing and transferred via delayer 143 are input to compensation value calculation section 1420. In this compensation value calculation section 1420, the difference between the average output power data S26 value and gain control signal S5 value is calculated by means of adder 152. The result of this addition is provided by adder 152 to difference compensation value converter 153, and difference compensation value converter 153 calculates a compensation value based on this output signal.

According to compensation value calculation section 1420 configured in this way, shown in FIG. 12, it is possible to estimate a characteristic of transmitting apparatus 100 from the difference between the gain control signal S5 value and average output power data S26 value, and so perform compensation table 121 compensation value updating, enabling the compensation table 121 compensation value updating time to be shortened compared with the case where compensation value calculation section 142 shown in FIG. 10 is used.

Thus, according to Embodiment 2, updating of compensation table 121 compensation value is performed continuously by compensation section 145, and it is possible to track characteristic variations due to temperature fluctuations or the like and correct the transmission output power of high-frequency power amplifier 105, enabling high-frequency amplification to be implemented with a high degree of precision.

Furthermore, according to Embodiment 2, compensation table 121 compensation value updating is performed using average output power, enabling the amount of computation and memory capacity to be reduced compared with the case where compensation is performed using instantaneous power utilizing amplitude or phase, and so making it possible to reduce the circuit scale of transmitting apparatus 100 and radio communication apparatus 200 and make these apparatuses smaller and lighter.

Embodiment 3

Figure 13:
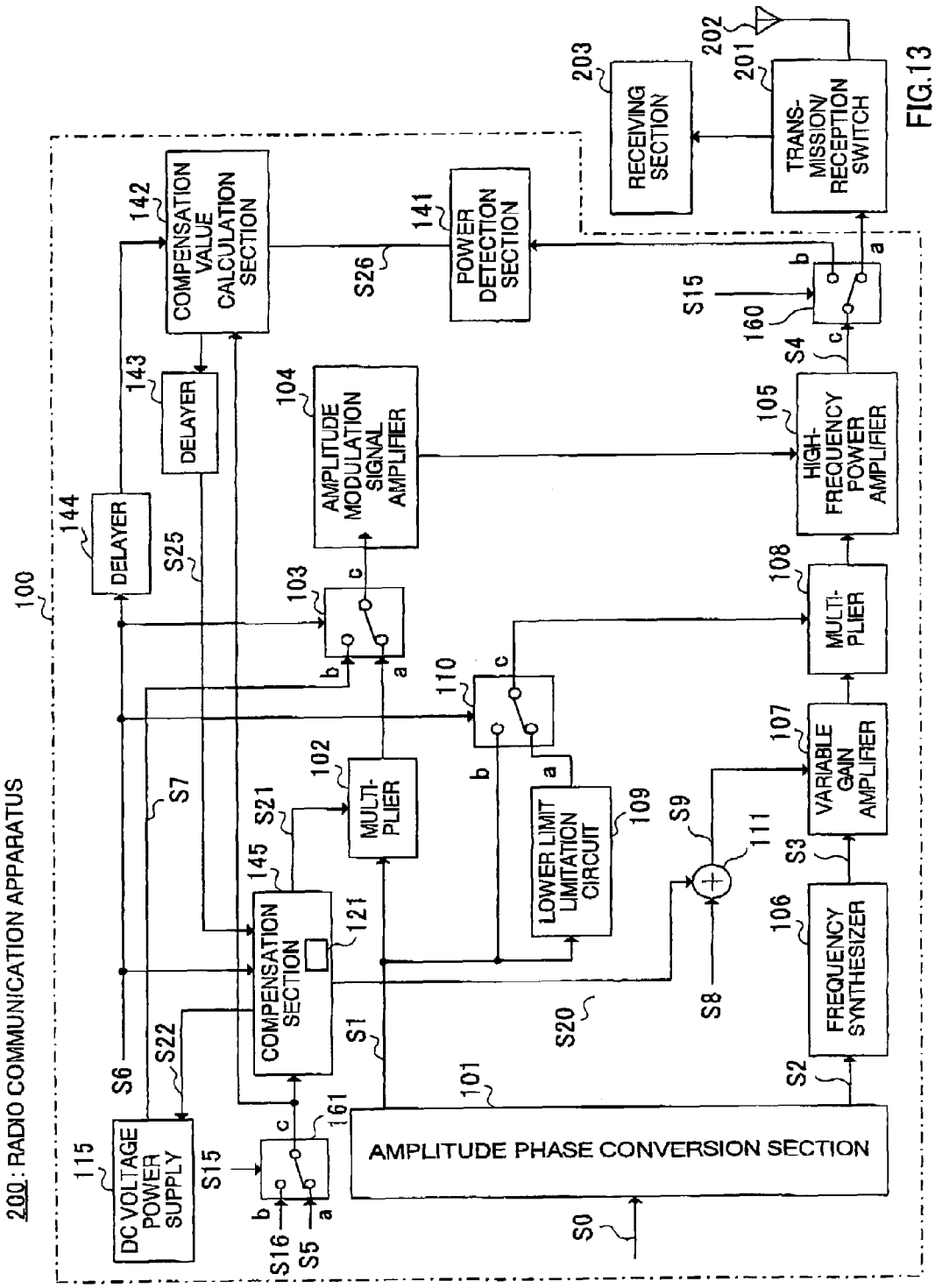
FIG. 13 is a block diagram showing the general configuration of a radio communication apparatus according to Embodiment 3 of the present invention.

Embodiment 3 of the present invention will now be described with reference to the accompanying drawings. FIG. 13 is a block diagram showing the configuration of a radio communication apparatus according to Embodiment 3 of the present invention. Configuration elements in Embodiment 3 of the present invention identical to those in Embodiments 1 and 2 of the present invention are assigned the same codes as in Embodiments 1 and 2, and descriptions thereof are omitted.

[Configuration of Transmitting Apparatus and Radio Communication Apparatus]

As shown in FIG. 13, a transmitting apparatus 100 and radio communication apparatus 200 according to Embodiment 3 of the present invention are equipped with a switch 160 provided in place of coupler 140 of transmitting apparatus 100 and radio communication apparatus 200 according to Embodiment 2 of the present invention, and a switch 161 that switches between input of gain control signal S5 and a compensation reference signal S16 in a stage prior to compensation section 145.

In this transmitting apparatus 100 and radio communication apparatus 200, in addition to the compensation control operations according to Embodiment 2, it is possible to switch between transmission power amplification and compensation table 121 compensation value updating. Switching control for both switch 160 and switch 161 is performed by means of a compensation control signal S15.

[Transmitting Apparatus and Radio Communication Apparatus Compensation Control Operation]

Figure 14:
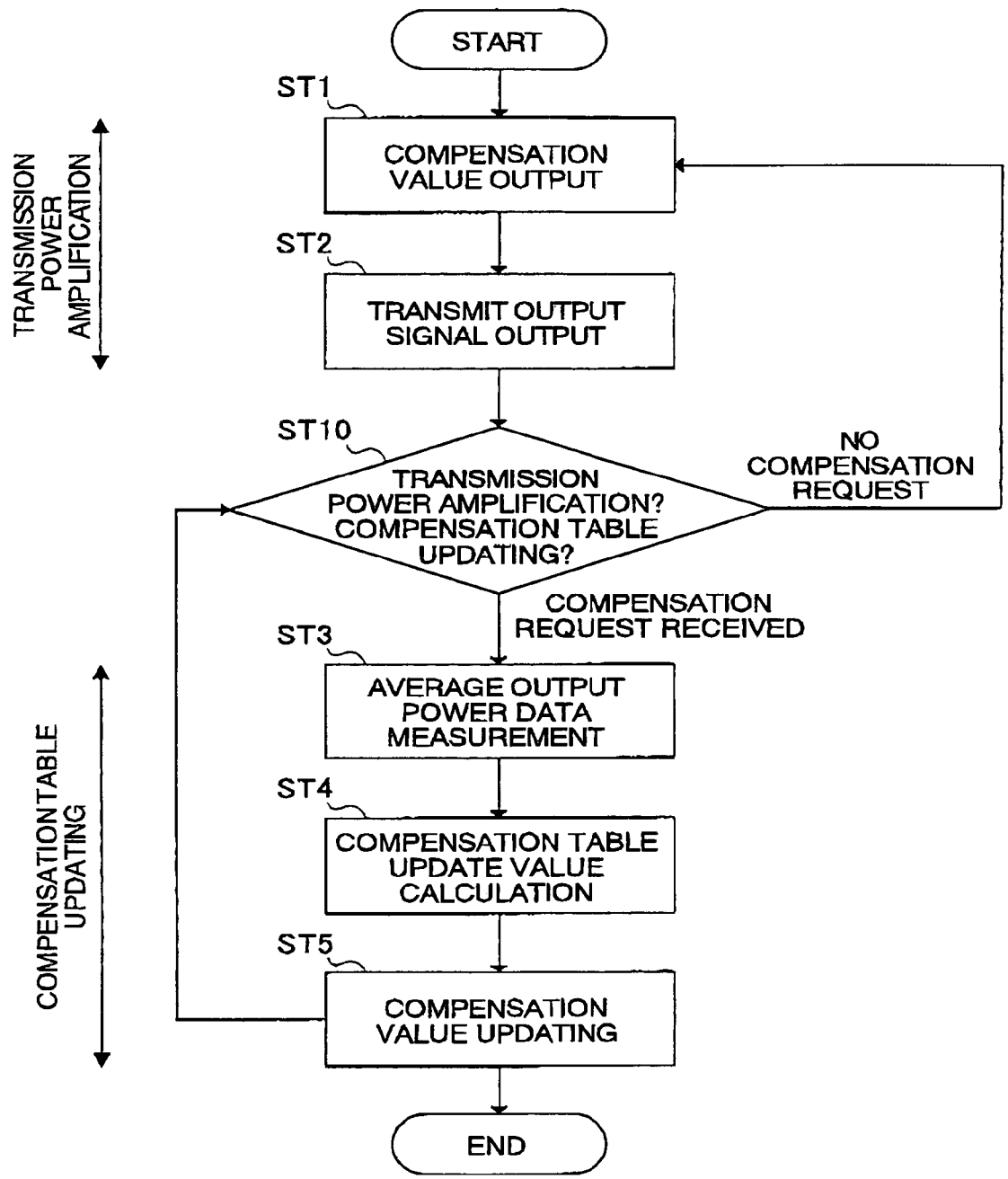
FIG. 14 is a flowchart explaining the compensation control operation of the transmitting apparatus and radio communication apparatus shown in FIG. 13.

A compensation control operation for the output power of a transmit output signal output from high-frequency power amplifier 105 in transmitting apparatus 100 and radio communication apparatus 200 according to Embodiment 3 of the present invention will now be described using FIG. 13 and FIG. 14.

Basically, a compensation control operation according to Embodiment 3, includes a step ST1 compensation value output step, a step ST2 transmit output signal S4 output step, and processing from a step ST3 average output power data S26 measurement step to an step ST5 compensation value updating step, as in a compensation control operation according to Embodiment 2, and further includes a step ST10 between step ST2 and step ST3 as a processing selection step for selecting either transmission power amplification processing or compensation table update processing.

In the case of compensation table 121 compensation value updating—that is, when there is a request to perform compensation table 121 compensation value updating—compensation control signal S15 is input to both switches 160 and 161 as shown in step ST10, and based on this compensation control signal S15, terminal b and terminal c are connected in switch 160, and terminal b and terminal c are connected in switch 161.

Based on the switching operation of switch 160, transmit output signal S4 output from high-frequency power amplifier 105 is input to power detection section 141 via switch 160, and the average output power can be measured by this power detection section 141.

Also, compensation reference signal S16 is input to compensation section 145 instead of gain control signal S5, and compensation table 121 compensation value updating can be performed based on this compensation reference signal S16. Compensation table 121 compensation value updating is performed only when there is a compensation value update request based on compensation control signal S15.

In the case of transmission power amplification, on the other hand, compensation control signal S15 is input to both switches 160 and 161, and based on this compensation control signal S15, terminal a and terminal c are connected in switch 160, and terminal a and terminal c are connected in switch 161. Based on the switching operation of switch 160, transmit output signal S4 output from high-frequency power amplifier 105 is input to transmission/reception switch 201 via switch 160. Transmit output signal S4 can be radiated from antenna 202 via transmission/reception switch 201. Also, based on the switching operation of switch 161, gain control signal S5 is input to compensation section 145.

As described above, according to embodiments of the present invention, high-frequency power amplifier 105 can be operated as a nonlinear amplifier in the case of high output power, enabling power efficiency to be improved. Also, according to embodiments of the present invention, in a portable radio terminal apparatus using a battery as a power source, in particular, battery exhaustion can be prevented, enabling usage time to be extended. Furthermore, according to embodiments of the present invention, since the power efficiency of high-frequency power amplifier 105 can be improved, transmitting apparatus 100 and radio communication apparatus 200 can be made smaller and lighter. Moreover, according to embodiments of the present invention, the reduction in size of transmitting apparatus 100 and radio communication apparatus 200 enables the amount of generated heat to be reduced.

Also, according to embodiments of the present invention, average output power compensation is performed based on compensation table 121 that stores two kinds of compensation values corresponding to a first mode and a second mode, enabling compensation value errors associated with mode switching to be eliminated, and characteristic variations between products and characteristic variations associated with temperature fluctuations to be smoothed out. A stable transmit output signal can therefore be transmitted by transmitting apparatus 100 and radio communication apparatus 200.

Furthermore, according to embodiments of the present invention, in the case of application to a base station apparatus of a radio system including a plurality of transmitting apparatuses 100 for which high power is required, since high-frequency power amplifier 105 can be made small in size and the amount of generated heat can be reduced, it is possible to prevent facilities from being excessively large, and to use the installation space effectively.

A transmitting apparatus according to a first aspect of the present invention has a configuration equipped with a transmission power amplification section that has a high-frequency power amplifier that outputs a transmit signal after performing power amplification of that signal, and a compensation section that performs compensation of the average output power of the high-frequency power amplification section; wherein the transmission power amplification section has a first mode in which the high-frequency power amplifier is operated as a nonlinear amplifier and amplitude modulation and average output level control of the transmit signal are performed based on the power supply voltage of the high-frequency power amplifier, and a second mode in which the high-frequency power amplifier is operated as a linear amplifier and amplitude modulation and average output level control of the transmit signal are performed in a stage prior to the high-frequency power amplifier; and the compensation section has a compensation table that stores compensation value information for correcting the average output level, and compensats the average output level based on the compensation value information stored in that compensation table.

According to this configuration, by operating the high-frequency power amplifier as a nonlinear amplifier in the first mode—for example, a high-output mode—power efficiency can be significantly increased, and by operating the high-frequency power amplifier as a linear amplifier in the second mode—for example, a low-output mode—transmission output power can be controlled over a wide range, a single amplifier can be used extremely efficiently, and power efficiency can be significantly increased.

Also, according to this configuration, compensation of average output power can be performed in accordance with transmitting apparatus characteristic variations due to variations in characteristics of a plurality of electronic parts of the transmitting apparatus, temperature fluctuations, or the like, enabling transmission power control to be performed with a high degree of precision and with stable characteristics.

A transmitting apparatus according to a second aspect of the present invention has a configuration in which the transmission power amplifier of the first aspect of the present invention is equipped with a multiplier located in a stage prior to the high-frequency power amplifier, and a variable gain amplifier located in a stage prior to that multiplier; wherein, in the second mode, the multiplier controls amplitude modulation of the transmit signal, and the variable gain amplifier controls the average output level of the transmit signal.

According to this configuration, since in the second mode the high-frequency power amplifier performs linear operation and the power supply voltage of the high-frequency power amplifier is constant, transmit signal amplitude modulation and average output level control cannot be performed by the high-frequency power amplifier, but amplitude modulation of the transmit signal can be performed by a multiplier located in a prior stage, and average output level of the transmit signal can be performed by a variable gain amplifier located in a stage prior to the multiplier, enabling linear operation of the high-frequency power amplifier to be implemented, and transmission output power to be controlled over a wide range.

Also, according to this configuration, compensation of average output power can be performed in accordance with transmitting apparatus characteristic variations due to variations in characteristics of a plurality of electronic parts of the transmitting apparatus, temperature fluctuations, or the like, enabling transmission power control to be performed with a high degree of precision and with stable characteristics.

A transmitting apparatus according to a third aspect of the present invention has a configuration in which, in the first or second aspect of the present invention, in the first mode the input level of the high-frequency power amplifier is varied in accordance with the average output power of the transmit signal.

According to this configuration, since the input level of the high-frequency power amplifier is varied in accordance with the average output power of the transmit signal, leakage power can be reduced, and in nonlinear operation of the high-frequency power amplifier, it is possible to extend the range of transmission output power control by means of the power supply voltage.

Also, according to this configuration, compensation of average output power can be performed in accordance with transmitting apparatus characteristic variations due to variations in characteristics of a plurality of electronic parts of the transmitting apparatus, temperature fluctuations, or the like, enabling transmission power control to be performed with a high degree of precision and with stable characteristics.

A transmitting apparatus according to a fourth aspect of the present invention has a configuration in which, in any of the first through third aspects of the present invention, in the first mode the input level of the high-frequency power amplifier is varied in accordance with the instantaneous output power of the transmit signal.

According to this configuration, in addition to attaining the effects of any of the first through third aspects of the present invention, since the input level of the high-frequency power amplifier can be varied in accordance with the instantaneous output power of the transmit signal, instantaneous level fluctuations can be tracked, leakage power can also be reduced, and instantaneous level fluctuation reproducibility can be improved.

A transmitting apparatus according to a fifth aspect of the present invention has a configuration in which, in the first aspect of the present invention, the compensation table stores compensation value information that compensats the power supply voltage value of the high-frequency power amplifier in the first mode, and compensation value information that corrects the input level of the high-frequency power amplifier in the second mode.

According to this configuration, in addition to attaining the effect of the first aspect of the present inventions compensation of average output power can be performed on a mode-by-mode basis in accordance with transmitting apparatus characteristic variations due to variations in characteristics of a plurality of electronic parts of the transmitting apparatus, temperature fluctuations, or the like, enabling transmission power control to be performed with a higher degree of precision and with stable characteristics.

A transmitting apparatus according to a sixth aspect of the present invention has a configuration in which, in the first aspect of the present invention, the compensation table stores compensation value information that compensats the supply voltage value for compensating the input level and the average output level for operating the high-frequency power amplifier as a nonlinear amplifier in the first mode, and compensation value information that compensats the input level for compensating the power supply voltage and the average output level for operating the high-frequency power amplifier as a linear amplifier in the second mode.

According to this configuration, in addition to attaining the effect of the first aspect of the present invention, the high-frequency power amplifier power supply voltage and input level can be compensated on a mode-by-mode basis in compensation of average output power in accordance with transmitting apparatus characteristic variations due to variations in characteristics of a plurality of electronic parts of the transmitting apparatus, temperature fluctuations, or the like, enabling transmission power control to be performed with a higher degree of precision and with stable characteristics.

Also, according to this configuration, since compensation is performed using average output power, the amount of processing and memory capacity can be reduced, and the circuit scale made smaller, compared with the case where compensation is performed using instantaneous power.

A transmitting apparatus according to a seventh aspect of the present invention has a configuration in which, in the fifth or sixth aspect of the present invention, the compensation section further includes a power detection section that detects the average output power output from the high-frequency power amplifier, a compensation value calculation section that calculates a compensation value based on the average output power detected by the power detection section, and a compensation value updating section that updates the compensation value stored in the compensation table by means of the compensation value calculated by the compensation value calculation section.

According to this configuration, in addition to attaining the effect of the fifth or sixth aspect of the present invention, a compensation value is calculated based on the average output power detected by the power detection section and a compensation value stored in the compensation table is updated with this calculated compensation value, enabling transmission power control to be performed with a high degree of precision and with stable characteristics.

A radio communication apparatus according to an eighth aspect of the present invention has a configuration equipped with a transmitting apparatus according to the first aspect of the present invention, and an antenna that receives a transmit signal from the transmitting apparatus and generates and outputs a radio transmit signal.

According to this configuration, in the first mode, since the power efficiency of the transmitting apparatus can be increased, the period of use of a power source such as a battery can be extended, and the high-frequency power amplifier of the transmitting apparatus can be made smaller, enabling the communication apparatus to be made small and light.

The present invention is not limited to the above-described embodiments, and various variations and modifications may be possible without departing from the scope of the present invention.

The present invention has the effects of providing good power efficiency and a wide transmission output power control range, and enabling stable power to be output, and is effective for a portable terminal apparatus such as a mobile phone or a portable information terminal, a radio communication apparatus in a radio base station or the like, and so forth.

This application is based on Japanese Patent Application No. 2004-065641 filed on Mar. 9, 2004, the entire content of which is expressly incorporated by reference herein.

What is claimed is:

1. A transmitting apparatus comprising:
a transmission power amplification section that has a high-frequency power amplifier that performs power amplification of a transmit signal to output that signal; and
a compensation section that performs compensation of average output power of said high-frequency power amplifier; wherein:
said transmission power amplification section has a first mode in which said high-frequency power amplifier is operated as a nonlinear amplifier and amplitude modulation of said transmit signal and control of an average output level of said transmit signal are performed based on a power supply voltage of said high-frequency power amplifier, and a second mode in which said high-frequency power amplifier is operated as a linear amplifier and amplitude modulation of said transmit signal and control of said average output level of said transmit signal are performed in a stage prior to said high-frequency power amplifier; and
said compensation section has a compensation table that stores compensation value information for compensating said average output level, and compensates said average output level based on said compensation value information stored in said compensation table.

2. The transmitting apparatus according to claim 1, wherein said transmission power amplifier comprises:
a multiplier located in a stage prior to said high-frequency power amplifier; and
a variable gain amplifier located in a stage prior to said multiplier; and wherein,
in said second mode, said multiplier controls amplitude modulation of said transmit signal, and said variable gain amplifier controls an average output level of said transmit signal.

3. The transmitting apparatus according to claim 1, wherein in said first mode an input level of said high-frequency power amplifier is varied in accordance with average output power of said transmit signal.

4. The transmitting apparatus according to claim 1, wherein in said first mode an input level of said high-frequency power amplifier is varied in accordance with instantaneous output power of said transmit signal.

5. The transmitting apparatus according to claim 1, wherein said compensation table stores compensation value information that compensates a power supply voltage value of said high-frequency power amplifier in said first model, and compensation value information that compensates an input level of said high-frequency power amplifier in said second mode.

6. The transmitting apparatus according to claim 1, wherein said compensation table stores compensation value information that compensates a supply voltage value for compensating an input level and average output level for operating said high-frequency power amplifier as a nonlinear amplifier in said first mode, and compensation value information that compensates an input level for compensating a power supply voltage and said average output level for operating said high-frequency power amplifier as a linear amplifier in said second mode.

7. The transmitting apparatus according to claim 5, wherein said compensation section further comprises:

a power detection section that detects average output power output from said high-frequency power amplifier;

a compensation value calculation section that calculates a compensation value based on average output power detected by said power detection section; and a compensation value updating section that updates said compensation value stored in said compensation table by means of said compensation value calculated by said compensation value calculation section.

8. A radio communication apparatus comprising:

the transmitting apparatus according to claim 1; and an antenna that receives a transmit signal from said transmitting apparatus and generates and outputs a radio transmit signal.

* * * * *

UNITED STATES PATENT AND TRADEMARK OFFICE
CERTIFICATE OF CORRECTION

PATENT NO. : 7,363,014 B2  Page 1 of 1
APPLICATION NO. : 11/074008
DATED : April 22, 2008
INVENTOR(S) : Maki Nakamura et al.

It is certified that error appears in the above-identified patent and that said Letters Patent is hereby corrected as shown below:

In claim 5, column 19, line 2 currently reads:

"of said high-frequency power amplifier in said first model,"

and should read:

"of said high-frequency power amplifier in said first mode,"

Signed and Sealed this

Seventeenth Day of February, 2009

JOHN DOLL
*Acting Director of the United States Patent and Trademark Office*